United States Patent
Yi et al.

(10) Patent No.: US 8,859,086 B2
(45) Date of Patent: Oct. 14, 2014

(54) BONDED STRUCTURE OF TOUCH SCREEN WITH FLEXIBLE CIRCUIT BOARD FOR PREVENTING OVERFLOW AND BONDING METHOD THEREOF

(75) Inventors: Xin Yi, Jiangsu (CN); Jianshe Bi, Hubei (CN)

(73) Assignee: HannStar Display(Nanjing) Corp., Nanjing Economic & Technology Development Zone, Nanjing (CN)

(*) Notice: Subject to any disclaimer, the term of this patent is extended or adjusted under 35 U.S.C. 154(b) by 254 days.

(21) Appl. No.: 13/480,465

(22) Filed: May 24, 2012

(65) Prior Publication Data
US 2012/0301656 A1     Nov. 29, 2012

(30) Foreign Application Priority Data
May 27, 2011 (CN) .......................... 2011 1 0139917

(51) Int. Cl.
    *B32B 3/06*         (2006.01)
    *G06F 3/041*      (2006.01)
    *H05K 3/36*       (2006.01)

(52) U.S. Cl.
    CPC ................ *G06F 3/041* (2013.01); *H05K 3/361* (2013.01); *G06F 2203/04103* (2013.01)
    USPC ........................... 428/214; 428/212; 428/218

(58) Field of Classification Search
    CPC ................... H05K 3/361; H05K 3/368; G06F 2203/04103; G06F 3/045
    USPC ........................... 428/212, 214, 218; 345/173
    See application file for complete search history.

(56) References Cited

FOREIGN PATENT DOCUMENTS

| CN | 101950225 A | 1/2011 |
| TW | 539179 | 6/2003 |

*Primary Examiner* — Alexander Thomas
(74) *Attorney, Agent, or Firm* — Winston Hsu; Scott Margo

(57) ABSTRACT

The present invention provides a bonded structure of a flexible circuit board of a touch screen for preventing overflow including a touch sensor panel having a flexible circuit board adhered thereon. The flexible circuit board and/or the touch sensor panel have a glue dam disposed thereon, and a length of the glue dam is larger than a width of the flexible circuit board. The bonded structure of the flexible circuit board of the touch screen for preventing overflow in the present invention disposes the glue dam at a position at the bonding area of the flexible circuit board bonded to the touch sensor panel to effectively reduce the overflow to a side of the flexible circuit board outside the touch sensor panel, and an appearance of the overflow and voids during bonding could be avoided.

10 Claims, 6 Drawing Sheets

BONDED STRUCTURE OF TOUCH SCREEN WITH FLEXIBLE CIRCUIT BOARD FOR PREVENTING OVERFLOW AND BONDING METHOD THEREOF

BACKGROUND OF THE INVENTION

1. Field of the Invention

The present invention relates to a bonded structure of a touch screen, and more particularly, to a bonded structure of a touch screen with a flexible circuit board for preventing overflow and a bonding method thereof.

2. Description of the Prior Art

For convenience in operation, people recently replace the mouse or the keyboard with the touch screen. The users should use a finger or other objects to touch screen assembled in front of the display, and then, the system could locate the selected input information according to the pattern or the function list touched by the finger. The touch screen is composed of a touch detecting device, such as touch sensor, and a touch screen controller. The touch sensor is assembled in front of a liquid crystal display screen and used to detect a position touched by user. The touch sensor is connected to a printed circuit board of the touch screen controller through a flexible circuit board. The main function of the touch screen controller is to receive touch information from the touch sensor, and to convert it into touch point coordinate. Further, the touch point coordinate is sent to the CPU, and the touch screen could receive the command from CPU and execute it simultaneously.

In order to achieve a design of a capacitive touch sensing, the transparent touch sensor must be sandwiched between transparent protective layers regularly. The transparent touch sensor usually is transparent conductive film, which is indium tin oxide (ITO) film. The ITO has good conductivity and transparency.

Any void generated by uneven bonding would reduce touch function and affect appearance of product. In order to guarantee better bonding, the UV adhesive should be used due to having the advantages of convenient usage, thin adhesive layer, and high optical quality (transparency larger than 95%).

However, as shown in FIG. 1, after an end of a flexible circuit board 6 for connecting the touch screen controller is bonded on the touch sensor panel 1, the bonding area of the flexible circuit board 6 has a height. Furthermore, before bonding the touch sensor panel 1 to a transparent protective layer, the UV adhesive should be uniformly coated on the touch sensor panel 1, and the height of the bonding area of the flexible circuit board 6 would have capillary action to drain the liquid UV adhesive, and the UV adhesive would be overflowed from the bonding area of the flexible circuit board 6 due to the height of the flexible circuit board 6. Thus, the flexible circuit board 6 at the bonding area has much overflowed adhesive 3, and the spilled adhesive 3 even has a depth of 5 to 7 millimeter or more, which directly affect the following assembling process and doesn't conform the manufacturing requirement.

SUMMARY OF THE INVENTION

It is therefore an objective of the present invention to provide a bonded structure of a touch screen with a flexible circuit board for preventing overflow and a bonding method to avoid the above-mentioned defect of overflow.

A bonded structure of a touch screen with a flexible circuit board for preventing overflow includes a touch sensor panel, a flexible circuit board, an ultraviolet (UV) adhesive, and a glue dam. The touch sensor panel has a transparent conductive film, and the flexible circuit board is bonded to the touch sensor panel. The UV adhesive is disposed on the touch sensor panel. The glue dam is disposed on the flexible circuit board, the touch sensor panel, or the flexible circuit board and the touch sensor panel, and a length of the glue dam is larger than a width of the flexible circuit board. The glue dam is disposed on the flexible circuit board, a sum of a thickness of the flexible circuit board and a height of the glue dam is equal to or smaller than a height of the UV adhesive.

The glue dam is disposed on the touch sensor panel, and a height of the glue dam is equal to or smaller than a height of the UV adhesive; or, the glue dam is disposed on the touch sensor panel and the flexible circuit board, and the thickness of the glue dam disposed on the touch sensor panel is equal to or smaller than the height of the UV adhesive.

The glue dam is strip-shaped.

A width of the glue dam is substantially between 0.1 millimeters and 0.25 millimeters.

The glue dam is another UV adhesive, and a density of the glue dam is larger than a density of the UV adhesive disposed on the touch sensor panel.

A bonding method of a touch screen for preventing overflow includes following steps:

(a) bonding a flexible circuit board to a touch sensor panel so as to electrically connect the flexible circuit board and the touch sensor panel;

(b) coating an UV adhesive on the touch sensor panel, and coating a glue dam having a density larger than a density of the UV adhesive disposed on the touch sensor panel and overlapping a bonding area of the flexible circuit board and the touch sensor panel by utilizing a bonding machine, wherein a height of the glue dam is equal to or smaller than a height of the UV adhesive disposed on the touch sensor panel;

(c) adhering a transparent protecting layer to the touch sensor panel through the UV adhesive; and (d) solidifying the UV adhesive to combine the touch sensor panel and the transparent protecting layer.

The step (a) includes disposing a conductive adhesive with a plurality of conductive particles on the bonding area of the flexible circuit board and the touch sensor panel.

The step (d) includes disposing a bonded structure of the touch sensor panel with the flexible circuit board and the transparent protecting layer in a bonding machine to be solidified by irradiating an UV light.

The step of disposing the bonded structure of the touch sensor panel with the flexible circuit board and the transparent protecting layer in the bonding machine includes disposing a surface of the touch sensor panel having the transparent protecting layer disposed thereon facing the UV light to solidify the UV adhesive.

The advantages of the present invention are as follows:

The bonded structure of the touch screen with the flexible circuit board disposes the glue dam at the bonding area of the flexible circuit board bonded to the touch sensor panel to effectively reduce overflow at the bottom end of the flexible circuit board and totally avoid the overflow and voids generated during bonding; and The glue dam also is another UV adhesive, so that the density difference between the UV adhesive of the glue dam and the UV adhesive of the touch sensor panel could be used to overcome the defect of larger fluidity and achieve manufacturing target. Furthermore, the touch screen after bonding the bonded structure of the touch screen with the flexible circuit board has a clear appearance and a good function so as to help to perform the following assembly process.

These and other objectives of the present invention will no doubt become obvious to those of ordinary skill in the art after reading the following detailed description of the preferred embodiment that is illustrated in the various figures and drawings.

DETAILED DESCRIPTION

The following description in combination with figures is utilized to describe the present invention.

A bonded structure of a touch screen with a flexible circuit board for preventing overflow includes a touch sensor panel 1 having a transparent conductive film, a flexible circuit board 6 bonded to the touch sensor panel 1, an ultraviolet (UV) adhesive 4 disposed on the touch sensor panel 1, and a glue dam 5 disposed on the flexible circuit board 6, the touch sensor panel 1, or the flexible circuit board 6 and the touch sensor panel 1, and a length of the glue dam 5 is larger than a width of the flexible circuit board 6. A width of the glue dam is substantially between 0.1 millimeters and 0.5 millimeters.

The glue dam 5 is another UV adhesive, and a density of the glue dam 5 is larger than a density of the UV adhesive 4 disposed on the touch sensor panel 1.

Figure 1:
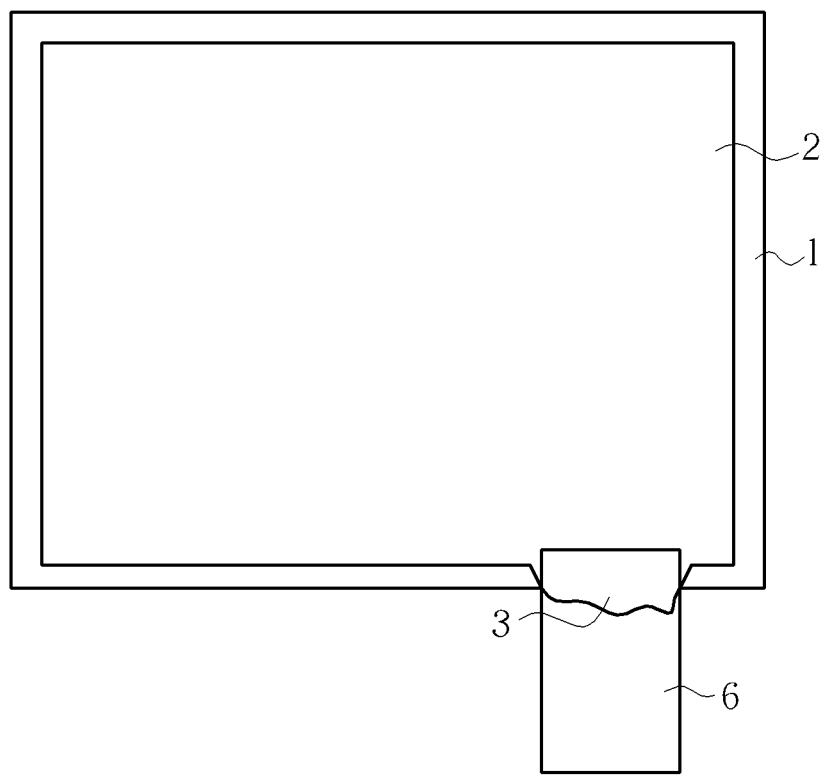
FIG. 1 is a schematic diagram illustrating a bonded structure of a touch screen with a flexible circuit board according to the prior art.
Figure 2:
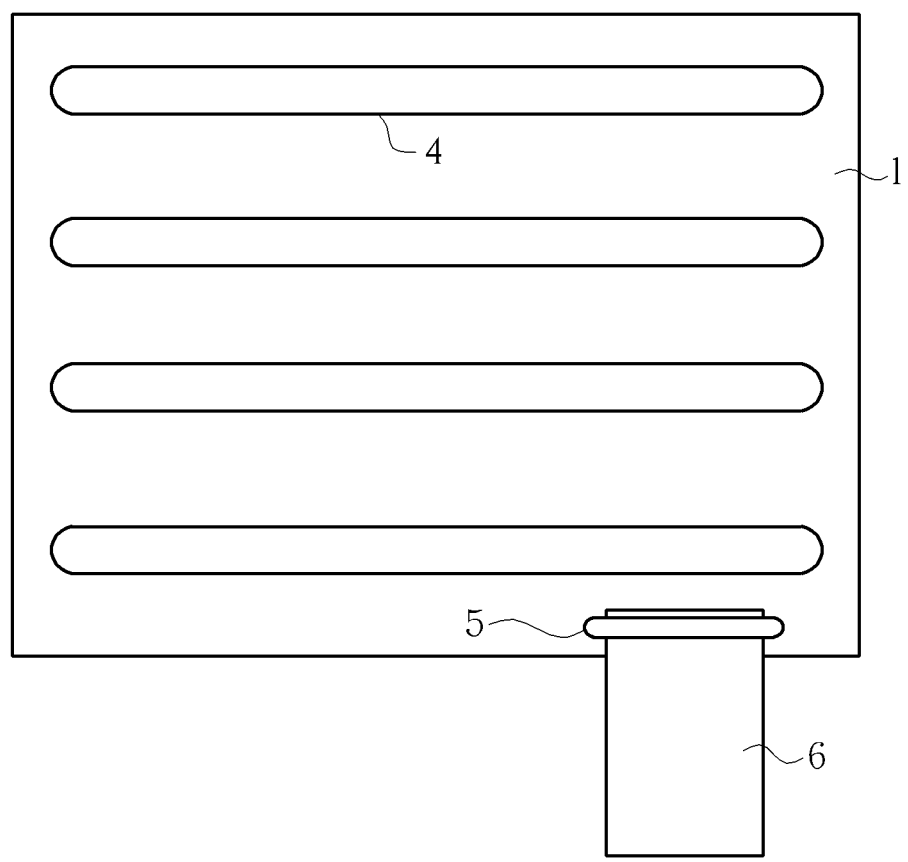
FIG. 2 is a schematic diagram illustrating a top view of a bonded structure of a touch screen with a flexible circuit board according to a first embodiment of the present invention.
Figure 3:
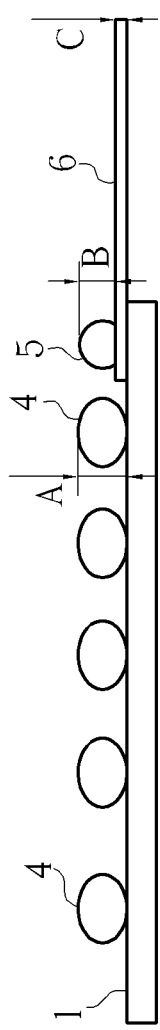
FIG. 3 is a schematic diagram illustrating a cross-sectional view of the bonded structure of the touch screen with the flexible circuit board according to the first embodiment of the present invention.

As shown in FIG. 2 and FIG. 3, the glue dam 5 is disposed on the flexible circuit board 6, and the UV adhesive 4 is disposed on the touch sensor panel 1. A sum of a thickness C of the flexible circuit board 6 and a height B of the glue dam 5 from a top surface of the flexible circuit board 6 to a top of the glue dam 5 is equal to or smaller than a height A of the UV adhesive 4 from a top surface of the touch sensor panel 1 to a top of the UV adhesive 4.

Figure 4:
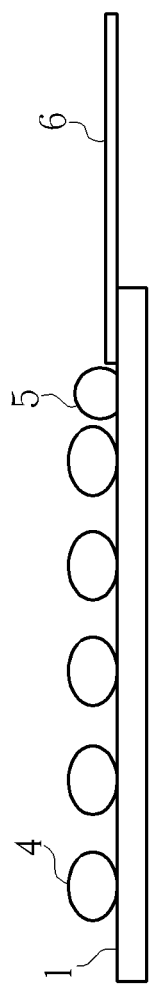
FIG. 4 is a schematic diagram illustrating a cross-sectional view of a bonded structure of a touch screen with a flexible circuit board according to a second embodiment of the present invention.

As shown in FIG. 4, the glue dam 5 is disposed on the touch sensor panel 1, and the UV adhesive 4 is disposed on the touch sensor panel 1. A height of the glue dam 5 from a top surface of the touch sensor panel 1 to a top of the glue dam 5 is equal to or smaller than the height of the UV adhesive 4 disposed on the touch sensor panel 1 from a top surface of the touch sensor panel 1 to a top of the UV adhesive 4.

Figure 5:
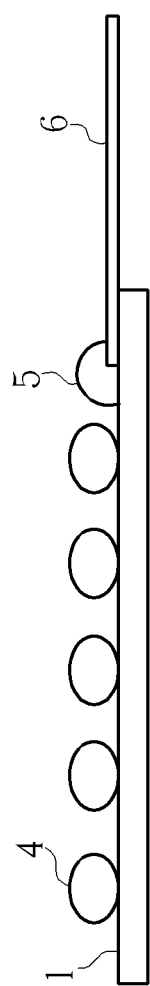
FIG. 5 is a schematic diagram illustrating a cross-sectional view of a bonded structure of a touch screen with a flexible circuit board according to a third embodiment of the present invention.

As shown in FIG. 5, the glue dam 5 is disposed on the touch sensor panel 1 and the flexible circuit board 6, which means that the glue dam 5 extends to cover both the touch sensor panel 1 and the flexible circuit board 6. The UV adhesive 4 is disposed on the touch sensor panel 1. The height of the glue dam 5 disposed on the touch sensor panel 1 from a top surface of the touch sensor panel 1 to a top of the glue dam 5 is equal to or smaller than the height of the UV adhesive 4 disposed on the touch sensor panel 1 from a top surface of the touch sensor panel 1 to a top of the UV adhesive 4.

Figure 6:
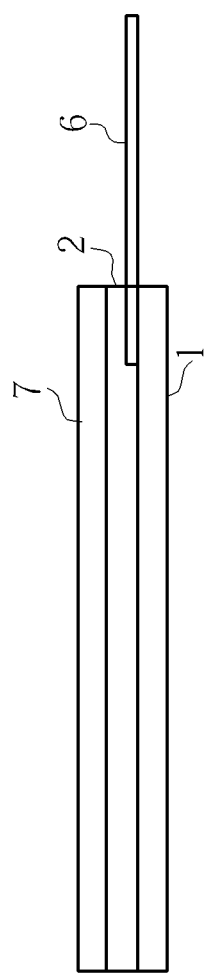
FIG. 6 is a schematic diagram illustrating a cross-sectional view of a touch screen after bonding the bonded structure of the touch screen with the flexible circuit board according to an embodiment of the present invention.

As shown in FIG. 6, after a transparent protecting layer 7 is bonded to the touch sensor panel 1, a space between the transparent protecting layer 7 and the touch sensor panel 1 is filled up with the solidified UV adhesive 2, and no overflow is generated so as to fit the manufacturing requirements.

The bonded structure could dispose a strip or a plurality of the glue dam 5 according to the actual requirements, and a position of the glue dam 5 also could be adjusted according to the actual requirements.

Since the glue dam 5 that is another UV adhesive has a density larger than a density of the UV adhesive 4 disposed on the touch sensor panel 1, the glue dam 5 has higher viscosity than the UV adhesive 4. When the glue dam 5 is used with the UV adhesive 4 disposed on the touch sensor panel 1 and used as an adhesive spread on the full surface of the touch sensor panel 1, the glue dam 5 could have a function of a dam for stopping the UV adhesive 4 so as to reduce the overflow of the UV adhesive 4 to the bottom side of the flexible circuit board 6.

A bonded structure of a touch screen with a flexible circuit board for preventing overflow includes the touch sensor panel 1 having the transparent conductive film, the flexible circuit board 6 bonded to the touch sensor panel 1, the UV adhesive 4 disposed on the touch sensor panel 1, and the glue dam 5 disposed on the flexible circuit board 6 and/or the touch sensor panel 1, and the length of the glue dam 5 is larger than the width of the flexible circuit board 6.

The glue dam 5 is disposed on the flexible circuit board 6, and the UV adhesive 4 is disposed on the touch sensor panel 1. A sum of a thickness C of the flexible circuit board 6 and a height B of the glue dam 5 from a top surface of the flexible circuit board 6 to a top of the glue dam 5 is equal to or smaller than a height A of the UV adhesive 4 from a top surface of the touch sensor panel 1 to a top of the UV adhesive 4.

The glue dam 5 is disposed on the touch sensor panel 1, and the UV adhesive 4 is disposed on the touch sensor panel 1. A height of the glue dam 5 from a top surface of the touch sensor panel 1 to a top of the glue dam 5 is equal to or smaller than the height of the UV adhesive 4 disposed on the touch sensor panel 1 from a top surface of the touch sensor panel 1 to a top of the UV adhesive 4.

The glue dam 5 is disposed on the touch sensor panel 1 and the flexible circuit board 6, and the UV adhesive 4 is disposed on the touch sensor panel 1. The height of the glue dam 5 disposed on the touch sensor panel 1 from a top surface of the touch sensor panel 1 to a top of the glue dam 5 is equal to or smaller than the height of the UV adhesive 4 disposed on the touch sensor panel 1 from a top surface of the touch sensor panel 1 to a top of the UV adhesive 4.

The glue dam 5 is strip-shaped, and the width of the glue dam is substantially between 0.1 millimeters and 0.5 millimeters.

The glue dam 5 is another UV adhesive, and a density of the glue dam 5 is larger than a density of the UV adhesive 4 disposed on the touch sensor panel 1.

A bonding method of a touch screen for preventing overflow includes following steps:

(a) the flexible circuit board 6 is bonded to the touch sensor panel 1 so as to electrically connect the flexible circuit board 6 and the touch sensor panel 1;

(b) the UV adhesive 4 is coated on the touch sensor panel 1, and another UV adhesive having a density larger than a density of the UV adhesive 4 disposed on the touch sensor panel 1 is coated on a bonding area of the flexible circuit board 6 bonded to the touch sensor panel 1 by utilizing a bonding machine to form a glue dam 5 extending to cover the area of the flexible circuit board 6 bonded to the touch sensor panel 1, wherein the length of the glue dam 5 is larger than the width of the flexible circuit board 6 about 2 millimeters, and the height of the glue dam 5 is equal to or smaller than the height of the UV adhesive 4 disposed on the touch sensor panel 1;

(c) adhering a transparent protecting layer to the touch sensor panel 1 through the UV adhesive 4, and the step (c) including:

disposing the transparent protecting layer 7 on a corresponding bonding stage;

aligning a semi-finished product and the transparent protecting layer 7;

pre-solidifying the touch sensor panel 1 and the transparent protecting layer 7 to perform an adhering process; and picking up the adhered product to check an appearance of the adhered product and if voids, shrink, or extension are generated; and (d) solidifying the UV adhesive 4 to combine the touch sensor panel 1 and the transparent protecting layer 7.

The step (a) includes following steps:

disposing a conductive adhesive, such as anisotropic conductive film, on the bonding area of the flexible circuit board bonded to the touch sensor panel;

aligning electrode points of the flexible circuit board 6 and electrode points of the touch sensor panel 1;

pre-pressing the flexible circuit board 6 on the touch sensor panel 1 so that the flexible circuit board 6 is in contact with the touch sensor panel 1; and bonding the flexible circuit board 6 to the touch sensor panel 1, so that the conductive particles of the conductive adhesive crack, and the flexible circuit board 6 is electrically connected to a corresponding circuit of the touch sensor panel 1.

The step (d) includes following steps:

solidifying a qualified product, and disposing a surface of the touch sensor panel 1 having the transparent protecting layer 7 disposed thereon and the UV adhesive 4 coated thereon facing the UV light to solidify the UV adhesive 4, wherein before solidifying an appearance of the product is inspected, and when the appearance of the product is not qualified, the unqualified product should be reworked.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bonded structure of a touch screen with a flexible circuit board for preventing overflow, comprising:

a touch sensor panel, having a transparent conductive film;
a flexible circuit board, bonded to the touch sensor panel;
an UV adhesive, disposed on the touch sensor panel; and
a glue dam, disposed on the flexible circuit board, the touch sensor panel, or the flexible circuit board and the touch sensor panel, and a length of the glue dam is larger than a width of the flexible circuit board.

2. The bonded structure of the touch screen with the flexible circuit board for preventing overflow according to claim 1, wherein the glue dam is disposed on the flexible circuit board, a sum of a thickness of the flexible circuit board and a height of the glue dam is equal to or smaller than a height of the UV adhesive.

3. The bonded structure of the touch screen with the flexible circuit board for preventing overflow according to claim 1, wherein the glue dam is disposed on the touch sensor panel, and a height of the glue dam is equal to or smaller than a height of the UV adhesive; or, the glue dam is disposed on the touch sensor panel and the flexible circuit board, and the thickness of the glue dam disposed on the touch sensor panel is equal to or smaller than the height of the UV adhesive.

4. The bonded structure of the touch screen with the flexible circuit board for preventing overflow according to claim 1, wherein the glue dam is a continuous structure.

5. The bonded structure of the touch screen with the flexible circuit board for preventing overflow according to claim 1, wherein the glue dam is strip-shaped.

6. The bonded structure of the touch screen with the flexible circuit board for preventing overflow according to claim 1, wherein a width of the glue dam is substantially between 0.1 millimeters and 0.25 millimeters.

7. The bonded structure of the touch screen with the flexible circuit board for preventing overflow according to claim 1, wherein the glue dam is another UV adhesive, and a density of the glue dam is larger than a density of the UV adhesive disposed on the touch sensor panel.

8. A bonding method of a touch screen for preventing overflow, comprising:

(a) bonding a flexible circuit board to a touch sensor panel so as to electrically connect the flexible circuit board and the touch sensor panel, wherein the touch sensor panel has a transparent conductive film;

(b) coating an UV adhesive on the touch sensor panel, and coating a glue dam on the flexible circuit board, the touch sensor panel, or the flexible circuit board and the touch sensor panel by utilizing a bonding machine, the glue dam having a density larger than a density of the UV adhesive disposed on the touch sensor panel, wherein a height of the glue dam is equal to or smaller than a height of the UV adhesive disposed on the touch sensor panel, and a length of the glue dam is larger than a width of the flexible circuit board;

(c) adhering a transparent protecting layer to the touch sensor panel through the UV adhesive; and (d) solidifying the UV adhesive to combine the touch sensor panel and the transparent protecting layer.

9. The bonding method of the touch screen for preventing overflow according to claim 8, wherein the step (a) comprising:

disposing a conductive adhesive with a plurality of conductive particles on a bonding area of the flexible circuit board bonded to the touch sensor panel.

10. The bonding method of the touch screen for preventing overflow according to claim 8, wherein the step (d) comprising:

disposing a surface of the touch sensor panel having the transparent protecting layer disposed thereon and the UV adhesive coated thereon to face an UV light to solidify the UV adhesive.

* * * * *